United States Patent [19]
Huh

[11] Patent Number: 5,684,681
[45] Date of Patent: Nov. 4, 1997

[54] DRIVE CIRCIUT OF SWITCHING ELEMENT FOR SWITCHING MODE POWER SUPPLY DEVICE

[75] Inventor: Dong-Young Huh, Kyeonggi-Do, Rep. of Korea

[73] Assignee: Daewoo Electronics Co., Ltd., Seoul, Rep. of Korea

[21] Appl. No.: 601,516

[22] Filed: Feb. 14, 1996

[30] Foreign Application Priority Data

Feb. 14, 1995 [KR]  Rep. of Korea .................. 95-2253

[51] Int. Cl.$^6$ ................................................ H02M 3/335
[52] U.S. Cl. ............................ 363/26; 327/412; 363/134
[58] Field of Search ............................. 363/24–26, 134; 331/114, 113 A; 327/412

[56] References Cited

U.S. PATENT DOCUMENTS

| 3,569,816 | 3/1971 | Marzolf | 363/24 |
| 3,873,903 | 3/1975 | Koetsch et al. | 363/25 |
| 4,133,025 | 1/1979 | Wurzburg | 363/41 |

Primary Examiner—Peter S. Wong
Assistant Examiner—Shawn Riley
Attorney, Agent, or Firm—Beveridge, DeGrandi, Weileher & Young LLP

[57] ABSTRACT

Described is a drive circuit of a switching element for controlling a switching element. The drive circuit of a switching element in the present invention includes a power conversion section for converting an alternating current inputted to a direct current; a switching element for switching the direct current of the power conversion section to load; an oscillator for generating a drive signal having rectangular pulse form with a predetermined cycle according to a control signal inputted from outside; a first control signal generator for generating a first control signal each time a drive signal of an oscillator is triggered from a low level to a high level; a second control signal generator for generating a second control signal each time a control signal inputted from outside is triggered from a high level to a low level; and a drive section for switching the switching element to turn-on state according to a first control signal and for switching the switching element to turn-off state according to a second control signal. As the first control signal is generated periodically and successively, precise switching of the switching element can be achieved even when the cycle of switching is low, and thus reducing the size of a transformer.

10 Claims, 4 Drawing Sheets

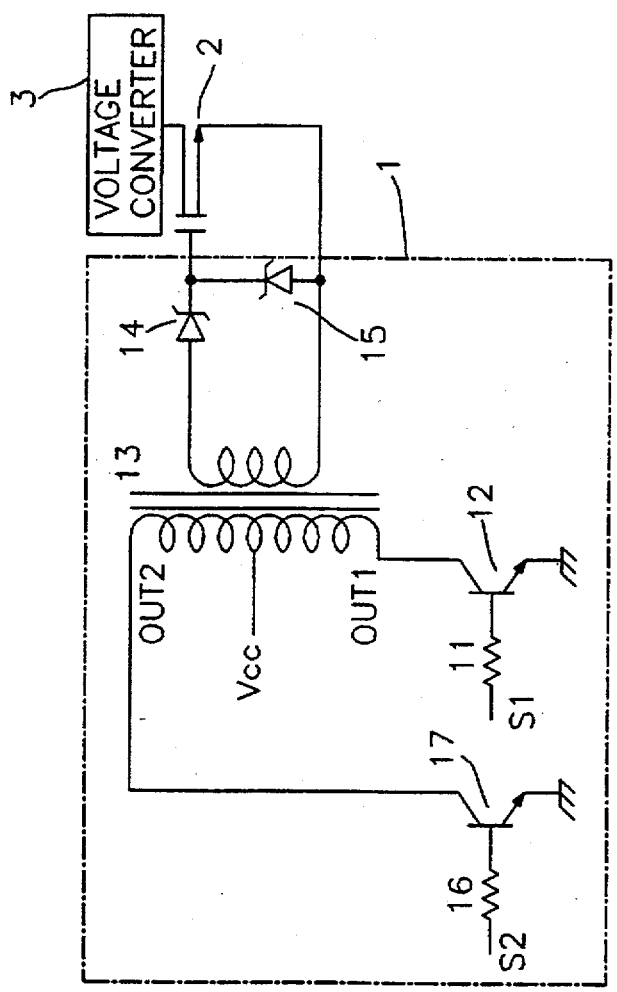
FIG. 1
PRIOR ART
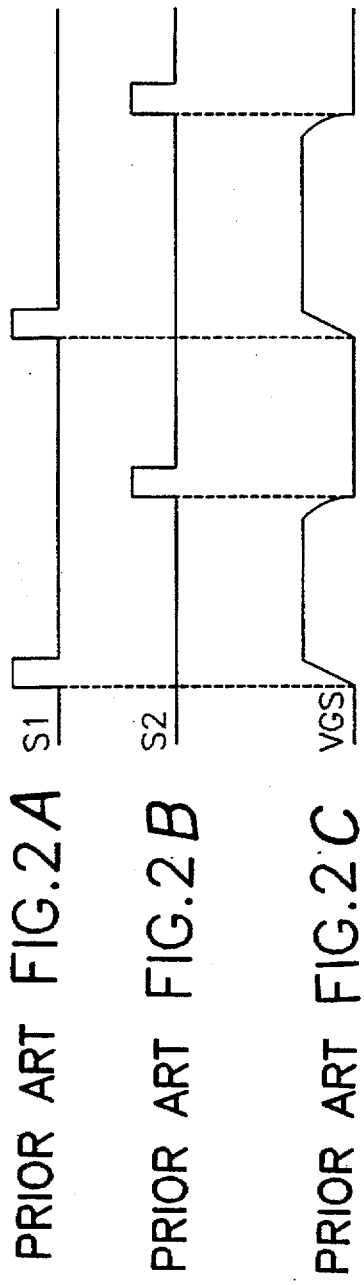
PRIOR ART FIG. 2A S1
PRIOR ART FIG. 2B S2
PRIOR ART FIG. 2C VGS

DRIVE CIRCIUT OF SWITCHING ELEMENT FOR SWITCHING MODE POWER SUPPLY DEVICE

BACKGROUND OF THE INVENTION

1. Field of the Invention

This invention is related to a switching mode power supply device, particularly to a drive circuit of a switching element to drive a switching element using a small-sized transformer.

2. Description of the Prior Art

A switching mode power supply device is generally comprised of a power conversion section to convert an alternating current inputted to a direct current; a switching element performing switching operation to supply a direct current of the power conversion section to load; and a drive circuit for controlling a switching element according to a first control signal and a second control signal inputted from outside. The switching element used in a MOS field effect invention which has less switching loss.

FIG. 1 shows a drive circuit 1 which performs switching operation of MOS field effect transistor 2 from turn-on state to turn-off state or vice versa in a switching mode power supply device using a MOS field effect transistor as a switching element. In order to switch a MOS field effect transistor 2 to turn-on state, a first control signal S1 inputted at a high level is supplied to an input terminal of a resistance 11, the base terminal of a first transistor 12 is connected to an output terminal of a resistance 11 to switch to turn-on state according to a first control signal S1, and a collector of the first transistor 12 is connected to a first output terminal OUT1 of primary winding of a transformer 13. At this time, an emitter of the first transistor 12 is connected to ground, and DC voltage Vcc is supplied to an input terminal of primary winding of a transformer 13.

A gate of a MOS field effect transistor 2 to switch to turn-on state by an excitation voltage of a transformer 13 is connected to secondary winding of a transformer 13, a power conversion section is connected to a drain of a MOS field effect transistor 2, and an output terminal of secondary winding of a transformer 13 is connected to a source of a MOS field effect transistor 2.

A Zener diode 14 is connected to a gate of a first transistor 12 to prevent electric potential VGS, formed between a gate of a MOS field effect transistor 2 and a source, from being supplied to an input terminal of secondary winding of a transformer 13, and at the same time, a Zener diode 15 is connected to a gate of a first transistor 12 to maintain electric potential VGS formed between a gate of a MOS field effect transistor 2 and a source at a constant valve.

In the meantime, a second control signal S2 inputted at a high level to switch a MOS field effect transistor 2 to turn-off state is supplied to an input terminal of a resistance 16, a base terminal of a second transistor 17 to switch to turn-on state by a second control signal S32 is connected to an output terminal of a resistance 16, and a collector of a second transistor 17 is connected to a second output terminal OUT2 of a first winding of a transformer 13. At this time, an emitter of a second transistor 17 is connected to ground.

The operation of a switching element drive circuit of a switching mode power supply device is illustrated below with reference to FIG. 2.

Once a first control signal S1 is triggered at a high level and supplied to a first transistor 12 through a resistance 11 of a drive circuit 1 as shown in FIG. 2(A), a first transistor 12 is switched to turn-on state. Accordingly, through primary winding of a transformer 13, a current flows from an input terminal to a first output terminal OUT1, thus making secondary winding of a transformer 13 excited.

The excitation voltage of a transformer 13 is supplied to a MOS field effect transistor 2 through a Zener diode 14 to switch a MOS field effect transistor 2 to turn-on state. Accordingly, a direct current outputted from a power conversion section 3 is supplied to a source of a MOS field effect transistor 2. At this time, electric potential VGS formed between a gate of a MOS field effect transistor 2 and a source should not exceed a predetermined voltage of a Zener diode 15.

In the meantime, if a second control signal S2 is triggered at a high level and supplied to a second transistor 17 through a resistance 16 as shown in FIG. 2(B), the second transistor 18 is switched to turn-on state. Accordingly, through primary winding of a transformer 13, a current flows from an input terminal to a second output terminal OUT2, thus making secondary winding of a transformer 13 excited. At this time, the excitation voltage of a transformer 13 has opposite electric potential to that excited when a current flows from an input terminal of a transformer 13 to a first output terminal OUT1.

The excitation voltage of a transformer 13 is supplied to a MOS field effect transistor 2 through a Zener diode 14 to switch a MOS field effect transistor 2 to turn-off state, and therefore, a source of DC power outputted from a power conversion section 3 is not supplied to a source of a MOS field effect transistor 2.

In a conventional drive circuit of a switching element, there has been a problem in the size of a transformer as being large which leads to a difficulty in making a power supply device light, compact, and simple. It is because precise switching of a MOS field effect transistor 2 in case of low switching cycle of a MOS field effect transistor 2 requires a large-sized transformer since a transformer 13 is driven by a first control signal S1 and second control signal S2, and a MOS field effect transistor 2 is switched by the excitation voltage of a transformer 13.

SUMMARY OF THE INVENTION

Therefore, an object of the invention is to provide a drive circuit of a switching element which can reduce the size of a transformer by generating control signals periodically to drive a transformer.

This and other objects may be achieved with a drive circuit of a switching element constructed according to the principles of the prevent invention which includes a power conversion section to convert an alternating current inputted from outside to a direct current; a switching element performing switching operation to supply a direct current of the power conversion section to load; an oscillator to generate drive signals in rectangular pulse form with a predetermined cycle according to a control signal inputted from outside; a first control signal generator to generate a first control signal each time a drive signal of an oscillator is triggered from a low level to a high level; a second control signal generator to generate a second control signal when a control signal inputted from outside is triggered from a high level to a low level; and a drive section to control switching of a switching element in such a way that a switching element is switched to turn-on state according to a first control signal of a first control signal generator, and a switching element is switched to turn-off state according to a second control signal of a second control signal generator.

Described in a preferred embodiment of the present invention is a drive circuit of a switching element in which drive signals having a predetermined cycle are generated periodically at an oscillator when a control signal inputted from outside is triggered to a high level; a first control signal is generated at a first control signal generator when a drive signal is triggered from a low level to a high level; and a second control signal is generated at a second control signal generator when a control signal inputted from outside is triggered from a high level to low level. Further, at a drive section, a switching element is switched to turn-on state according to a first control signal thus supplying a source of DC power outputted from a power conversion section to load, whereas a switching element is switched to turn-off state according to a second control signal thus not supplying a direct current of a power conversion section to load. Therefore, as a first control signal is generated periodically and successively, it is possible to reduce the size of a transformer for precise switching of a switching element even when the switching cycle of a switching element is low.

BRIEF DESCRIPTION OF THE DRAWINGS

The foregoing and other objects, aspects and advantages will be better understood from the following detailed description of a preferred embodiment of the invention with reference to the drawings, in which:

FIG. 1 is a block diagram of a conventional drive circuit of a switching element;

FIG. 2 is a diagram showing wave forms of output signals of FIG. 1;

DESCRIPTION OF THE PREFERRED EMBODIMENT

Figure 3:
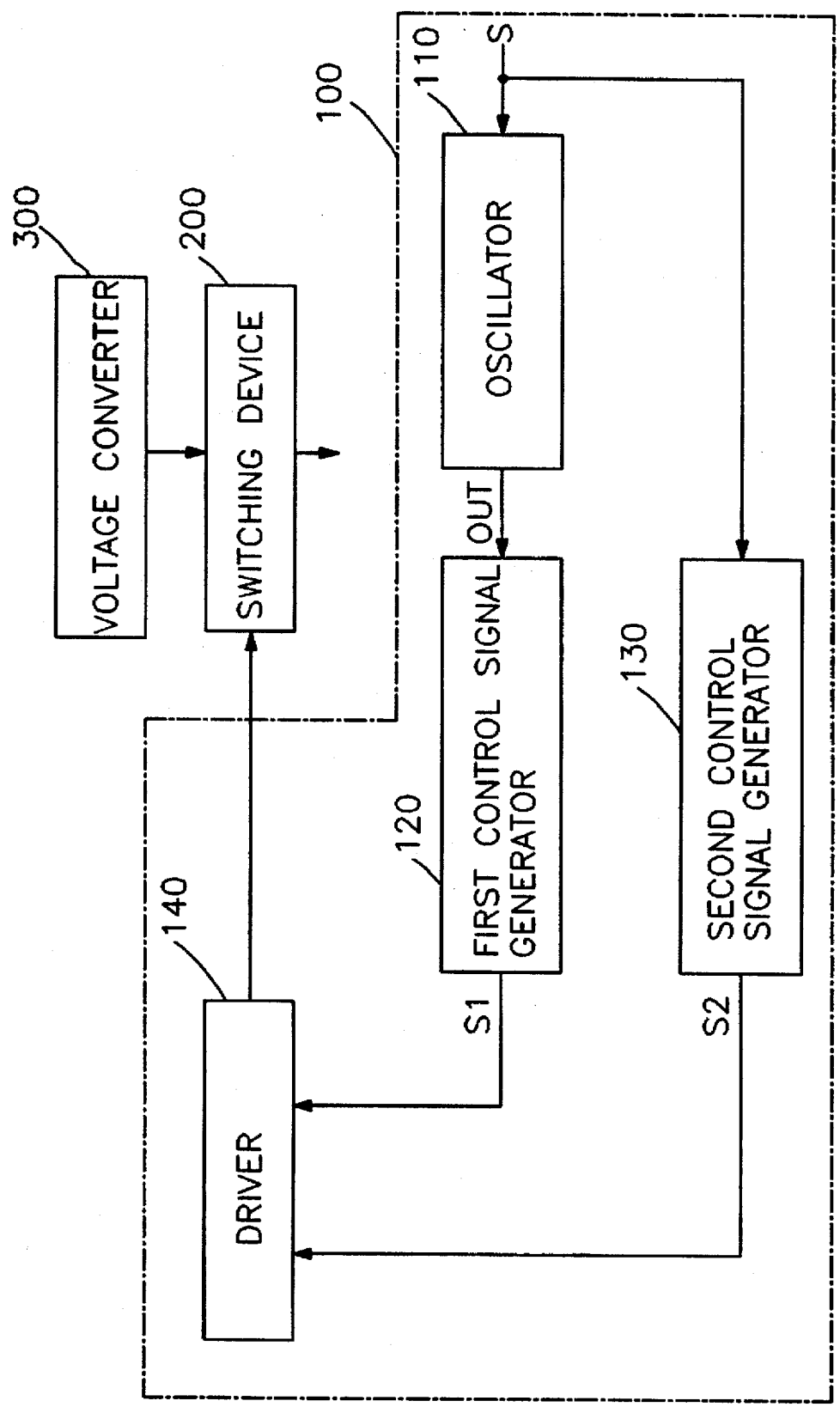
FIG. 3 is a block diagram of a drive circuit of a switching element constructed according to the principles of the prevent invention.

Referring to the drawings, a preferred embodiment of the prevent invention is illustrated below.

Figure 4:
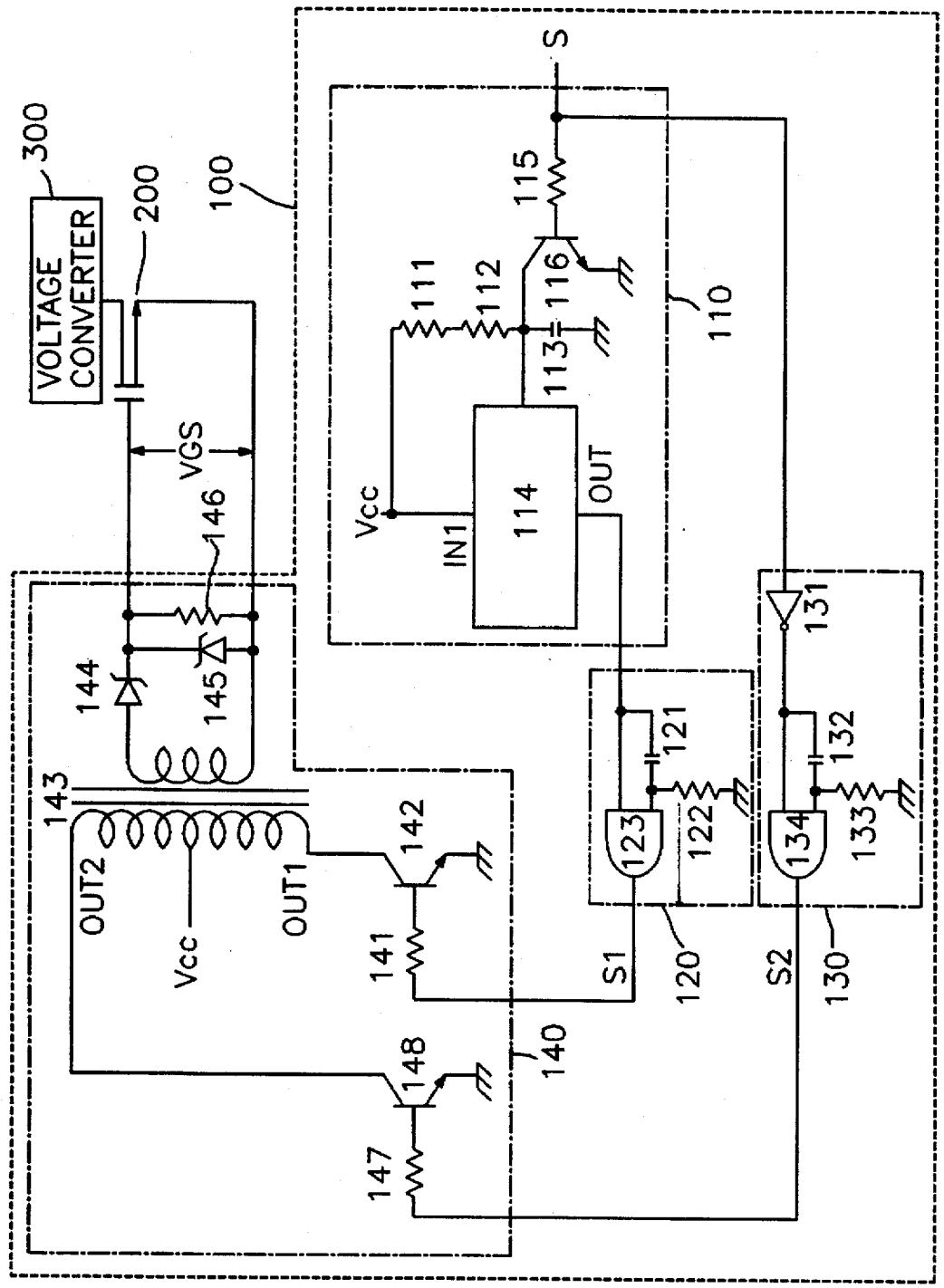
FIG. 4 is a detailed circuit diagram of a drive circuit of a switching element of FIG. 3.

As seen in FIGS. 3 and 4, a switching mode power supply device of the present invention is comprised of a power conversion section 300 which converts a source of AC power inputted to a source of DC power; a switching element 200 which is a MOS field effect transistor and which performs switching operation to supply a direct current of the power conversion section 300 to load; and a drive circuit 100 which controls a switching element 200 to do switching.

A power conversion section 300 and a switching element 200 operate in a conventional way and their illustration is omitted here. The drive circuit 100 of a switching element includes an oscillator 100 which generates drive signals OUT in rectangular pulse form with a predetermined cycle according to an input signal S, inputted from outside; a first control signal generator 120 to generate a first control signal S1 each time a drive signal OUT of an oscillator 110 is triggered from a low level to a high level; a second control signal generator 130 to generate a second control signal S2 when the input signal S inputted from outside is triggered from a high level to a low level; and a drive section 140 to control switching of a MOS field effect transistor 200 according to a first control signal S1 of a first control signal generator 120 as well as a second control signal S2 of a second control signal generator 130. Here, a control signal S inputted from outside is a signal triggered to a high level when a power good signal is outputted from a microprocessor (not shown).

FIG. 4 is a detailed circuit diagram of a drive circuit of the prevent invention. To an input terminal of a direct current Vcc, resistances 111, 112 of an oscillator 110 and a capacitor 113 are connected in series. The other end of the capacitor 113 is connected to ground. To an output terminal of a resistance 112, a multivibrator 114, which outputs a drive signal OUT in rectangular pulse form with a cycle corresponding to time constants of resistances 111, 112 and a capacitor 113, is connected. Further, a direct current Vcc is inputted through power terminal IN1 of a multivibrator 114, and initiates driving of a multivibrator 114.

A control signal S inputted from outside is supplied to an input terminal of a resistance 115 of an oscillator 110; a base terminal of a transistor 116, which is switched according to the input signal S, is connected to an output terminal of resistance 115; an output terminal of resistance 112 is connected to an emitter of the transistor 116; and a collector of the transistor 116 is connected to ground.

In the meantime, a first control signal generator 120, which generates a first control signal S1 to switch a MOS field effect transistor 200 to turn-on state according to the drive signal OUT of a multivibrator 114, includes a capacitor 121 to charge/discharge a drive signal OUT of a multivibrator 114, a resistance 122 to discharge charged voltage of the capacitor 121, and AND gate to generate a first control signal S1 by performing logical product of an output signal and drive signal OUT of the capacitor 121.

Further, a second control signal generator 130, which generates a second control signal S2 to switch a MOS field effect transistor 200 to turn-off state according to a control signal S inputted from outside, includes an inverter to return the input signal S, a capacitor 132 to charge/discharge an output signal of an inverter 131, a resistance 133 to discharge charged voltage of the capacitor 132, and AND gate to generate a second control signal S2 by performing logical product of an output signal and the input signal S of a capacitor 132.

To output terminals of a first control signal generator 120 and a second control signal generator 130, a drive section 140 for switching a MOS field effect transistor according to a first control signal S1 and a second control signal S2 is connected. To an output terminal of a resistance 141 of a drive section 140, through which a first control signal S1 of a first control signal generator 120 passes, a base terminal of a first transistor 142, which is switched according to an output voltage of a resistance 141, is connected; to a collector of a first transistor 142, a first output terminal OUT1 of primary winding of a transformer 143 at which a current flows through primary winding and secondary winding is excited when a first transistor 142 is in turn-on state; and to an input terminal of a transformer 143, a source of input power Vcc is supplied.

To an input terminal of secondary winding of a transformer 143, anode of a Zener diode 144 for preventing electric potential VGS, formed between a gate of a MOS field effect transistor 200 and a source, from being supplied to secondary winding of a transformer 143, is connected; and to cathode of a Zener diode 144, a gate of a MOS field effect transistor 200 is connected. Further, to a drain of a MOS field effect transistor 200, an output terminal of a power conversion section 300 which inverts an alternating current inputted to a direct current is connected; and to a source of a MOS field effect transistor 300, an output terminal of secondary winding of a transformer 143 is connected. To a drain of a MOS field effect transistor 200, a direct current is supplied, which is then supplied to an output terminal of secondary winding of a transformer 143 when a MOS field effect transistor 200 is switched to turn-on state.

To a gate of a MOS field effect transistor 200, cathode of a Zener diode 145, for protecting a MOS field effect transistor 200 by maintaining constantly electric potential VGS formed between a gate of a MOS field effect transistor 200 and a source, is connected; and anode of a Zener diode 145 is connected to a source of a MOS field effect transistor 200. a Further, between cathode and anode of a Zener diode 145, resistance 146, for protecting a MOS field effect transistor 200 by discharging electric potential VGS formed between a gate of a MOS field effect transistor 200 and a source, is connected.

In the meantime, to an output terminal of a resistance 147 of a drive section 140 through which a second control signal S2 of a second control signal generator 130 passes, a base terminal of a second transistor 148 which is switched according to an output voltage of a resistance 147 is connected; and to a collector of a second transistor 148, a second output terminal OUT2 of primary winding of a transformer 143 at which a current flows through primary winding and thus secondary winding is excited when a transistor 148 is switched to turn-on state. At this time, an excited voltage of secondary winding of a transformer 143 has opposite electric potential to that of an excited voltage of secondary winding of a transformer 143 when a first transistor 142 is turned on.

Figures 5A, 5B, 5C, 5D, 5E:
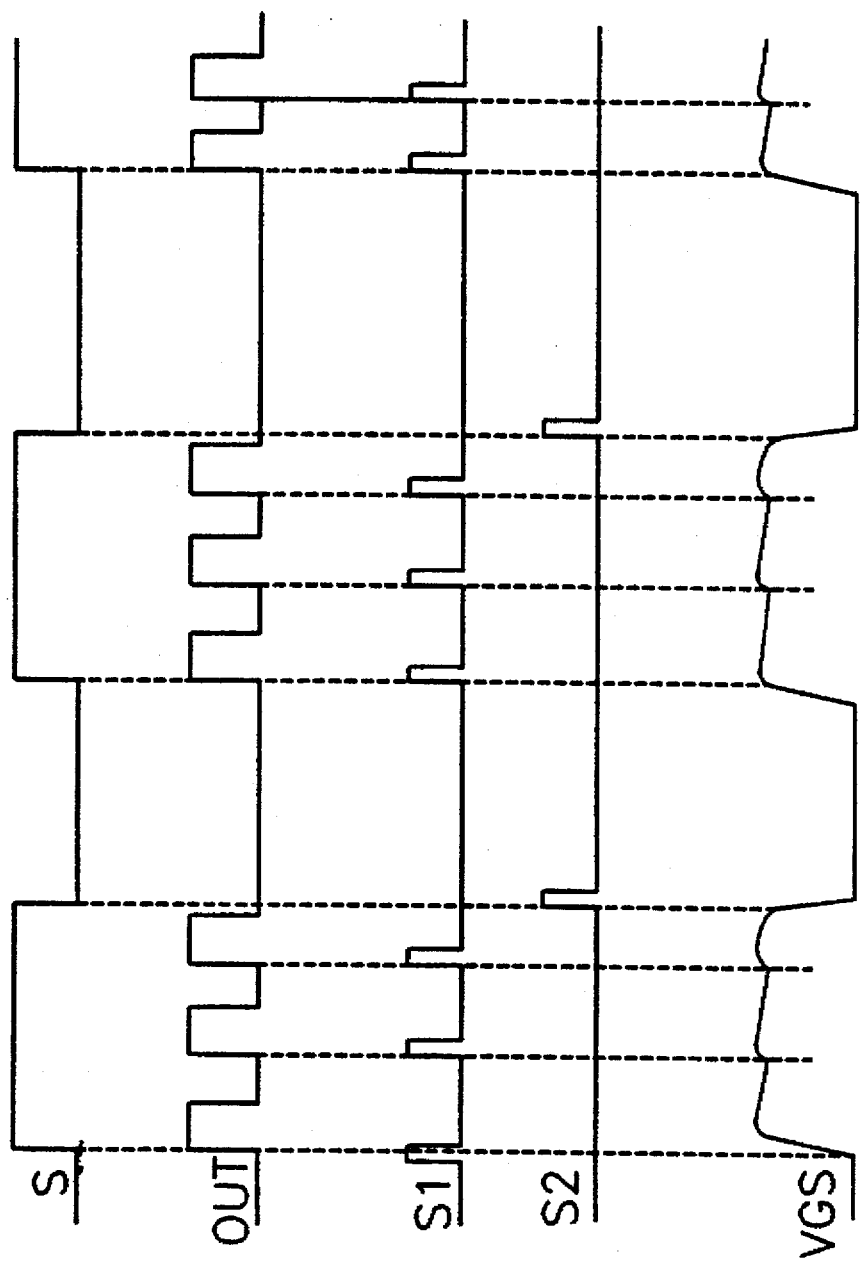
FIG. 5 is a diagram showing wave forms of output signals of FIG. 4.

FIG. 5 is a diagram showing wave forms of output signals of the components in FIG. 4. The operation of a MOS field effect transistor according to the present invention is illustrated below with reference to FIG. 5. FIG. 5(A) shows the input signal S inputted from outside and triggered to a high level.

Once a direct current Vcc is inputted to a multivibrator 114 of an oscillator 110 through an input terminal IN1, the multivibrator 114 initiates its operation and drive signals OUT having rectangular pulse forms as shown in FIG. 5(B) are outputted. The cycle of the drive signals OUT is determined according to the time constants of resistances 111, 112 and a capacitor 113. The drive signal OUT of a multivibrator 114 is supplied to a first control signal generator 120 at which a first control signal S1 for switching a MOS field effect transistor 200 to turn-on state is generated. For example, when the drive signal OUT is triggered from a low level to a high level, the triggered high-level drive signal OUT is supplied to a capacitor 121 and is charged. While the capacitor 121 is being charged, the output signal of the capacitor 121 is supplied to one end of AND gate 121 in a high level. The high-level drive signal OUT is supplied to another end of AND gate 123. Therefore, AND gate 123 performs logical product of the charged signal of the capacitor 121 and a drive signal, and outputs a first control signal S1.

Once charging of the capacitor 121 is completed, the charged voltage of the capacitor 121 is discharged through a resistance 122, and therefore, the output signal of the capacitor 121 is supplied to one end of AND gate 123 in a low level, and the high-level drive signal OUT is supplied to another end of AND gate 123 and its logical product is performed. The first control signal S1 of AND gate 123 is triggered from a high level to a low level. At this time, the region to be triggered from a high level to a low level is determined by time constants of the capacitor 121 and the resistance 122 as shown in FIG. 5(B).

Further, a first control signal S1 of a first control signal generator 120 is supplied to a drive section 140, and switches a MOS field effect transistor 200 to turn-on state. That is, a high-level first control signal S1 is supplied to a first transistor 142 through a resistance 141, and the first transistor is then switched to turn-on state.

In the meantime, a high-level control signal S is supplied to a second control signal generator 130 at which a second control signal S2 for switching a MOS field effect transistor 200 to turn-on state is outputted. In other words, a high-level input signal S is supplied to an inverter 131 of a second control signal generator 130 to invert the control signal S, while the output signal of the inverter 131 is supplied to one end of AND gate 134. At this time, according to the output signal of the inverter 131, a low-level second control signal S2 is outputted at AND gate 134. The low-level second control signal S2 is supplied to a second transistor 148 through resistance 147 of a drive section 140, and the second transistor 148 is switched to turn-off state.

Accordingly, at a transformer 143 a current flows from an input terminal of primary winding to a first output terminal OUT1, and secondary winding is excited. At this time, the excitation voltage of secondary winding is determined by a ratio of primary and secondary windings of the transformer 143.

The excitation voltage of secondary winding of a transformer 143 is supplied to a gate of a MOS field effect transistor 200 through a Zener diode 144, after which the MOS field effect transistor 200 is switched to turn-on state. That is, as a direct current outputted from the power conversion section 160 is supplied to a source of a MOS field effect transistor 200, loads connected to the source start to operate. At this time, electric potential VGS formed between a gate of a MOS field effect transistor and a source is shown in FIG. 5(E).

Since this procedure is repeated while drive signals OUT are outputted from a multivibrator 114, the MOS field effect transistor 200 maintains its turn-on state.

In the meantime, FIG. 5(A) shows how a control signal S is triggered to low level.

A low-level control signal S is supplied to a transistor 115 through a resistance 115 of an oscillator 110 to switch the transistor 115 to turn-on state, and therefore, the output voltage of a resistance 112 is supplied from an emitter of the transistor 115 to a collector. Further, as an outputted current of resistances 111, 112 is supplied to ground through a transistor 115, driving of a multivibrator 114 is stopped, and a low-level driving signal OUT is outputted as shown in FIG. 5(B).

The low-level drive signal OUT is supplied to one end of AND gate 123 of a first control signal generator 120, and therefore, a low-level first control signal S1 is outputted regardless of an output signal of the capacitor 121 supplied to another end of AND gate 123 as shown in FIG. 5(C). The low-level first control signal S1 is supplied to a first transistor 142 through a resistance 141 of a drive section 140, and a first transistor 142 is switched to turn-off state.

In the meantime, a low-level control signal S is supplied to a second control signal generator 130, and a second control signal S2 for switching a MOS field effect transistor 200 to turn-off state is outputted.

In other words, a low-level control signal S is supplied to an inverter 131 of a second control signal generator 130 and is inverted, while the output singal of the inverter 131 is supplied to one end of AND gate 134 as well as a capacitor 132. While the capacitor 132 is charged, the output signal of the capacitor 132 is supplied to another end of AND gate 134 at a high level. Therefore, AND gate 134 performs logical product of an output signal of the capacitor 132 and an output signal of the inverter 131, and thus outputs a second control signal S2.

Once charging of the capacitor 132 is completed, the charged voltage of the capacitor 132 is discharged through a resistance 133, and the output signal of the capacitor 132 supplied to another end of AND gate 134 is triggered to a low level. Therefore, AND gate 132 performs logical product of an output signal of the capacitor 132 and an output signal of the inverter 131, and triggers a high-level second control signal S2 to a low level as shown in FIG. 5(D).

Further, the second control signal S2 of a second control signal generator 130 is supplied to a drive section 140 to switch a MOS field effect transistor 200 to turn-on state. That is, a high-level second control signal S2 is supplied to a second transistor 148 through a resistance 147 to switch the second transistor 148 to turn-on state.

Accordingly, at a transformer 143 a current flows from an input terminal of primary winding to a second output terminal OUT2, thus making secondary winding excited. At this time, the excitation voltage of secondary winding of the transformer 143 has opposite electric potential to that of secondary winding when a current flows to an input terminal of primary winding as well as a first output terminal OUT1.

As the excitation voltage of secondary winding of a transformer 143 does not pass a Zener diode 144, a MOS field effect transistor 200 is switched to turn-off state. Therefore, the direct current generated from a power conversion section 300 is not outputted through a MOS field effect transistor.

By using a drive circuit of a switching element of the present invention, it can be expected to generate a first control signal according to drive signals generated successively through a multivibrator, and thus to reduce the size of a transformer, which is large to maintain turn-on state of a MOS field effect transistor, since turn-on state of the MOS field effect transistor can be maintained by a first control signal. Therefore, manufacture of a light, compact, and simple drive circuit of a switching element is facilitated, thus leading to achievement of miniaturization of a switching mode power supply device.

While the invention has been described in terms of a single preferred embodiment, those skilled in the art will recognize that the invention can be practiced with modification within the spirit and scope of the appended claims. For example, it is suggested to use a MOS field effect transistor of the present invention for any general switching element.

What is claimed is:

1. A drive circuit of a switching element for a switching mode power supply device, comprising:

a power conversion section for converting an inputted alternating current to a direct current;

a MOS field effect transistor for switching to supply said direct current to a load;

an oscillator for generating a drive signal to switch said MOS field effect transistor according to an input signal supplied from outside;

a control signal generator for generating a first control signal and a second control signal according to said drive signal of said oscillator and said input signal, wherein said first control signal and second control signal switch said MOS field effect transistor to a turn-on or turn-off state; and a drive section for generating an output signal supplied to said MOS field effect transistor, wherein said output signal is a high level according to said first control signal of high level and said output signal of high level switch said MOS field effect transistor to said turn-on state, and for generating said output signal supplied to said MOS field effect transistor, wherein said output signal is a low level according to said second control signal of high level and said output signal of low level switch said MOS field effect transistor to said turn-off state.

2. The drive circuit of a switching element for a switching mode power supply device as defined in claim 1, wherein said oscillator is comprised of:

said multivibrator for generating a drive signal having rectangular pulse form according to a DC voltage inputted from outside;

means for determining a cycle of said drive signal outputted from said multivibrator; and a transistor for stopping driving of said multivibrator according to said input signal.

3. The drive circuit of a switching element for a switching mode power supply device as defined in claim 2, wherein said means for determining a cycle of said drive signal is comprised of:

a first resistance for biasing a DC voltage inputted from outside;

a second resistance for biasing an output voltage of said first resistance; and a capacitor for determining a cycle of said drive signal by charging/discharging an output current of said second resistance.

4. The drive circuit of a switching element for a switching mode power supply device as defined in claim 1, wherein said control signal generator is comprised of:

a first control signal generator for generating said first control signal to switch said MOS field effect transistor to said turn-on state according to said drive signal of said oscillator; and a second control signal generator for generating said second control signal to switch said MOS field effect transistor to said turn-off state according to said input signal.

5. The drive circuit of a switching element for a switching mode power supply device as defined in claim 4, wherein said first control signal genetator is comprised of:

said capacitor for charging/discharging a drive signal of said multivibrator;

a resistance for discharging charged voltage of said capacitor; and

AND gate for outputting said first control signal by performing logical product of an output signal of said capacitor and said drive signal.

6. The drive circuit of a switching element for a switching mode power supply device as defined in claim 4, wherein said second control signal generator is comprised of:

an inverter for inverting said input signal;

a capacitor for charging/discharging an output signal of said inverter;

a resistance for discharging charged voltage of said capacitor; and

AND gate for outputting said second control signal by performing logical product of an output signal of said capacitor and said output signal of said inverter.

7. The drive circuit of a switching element for a switching mode power supply device as defined in claim 1, wherein said drive section is comprised of:

a first transistor for switching said MOS field effect transistor to said turn-on state according to said first control signal outputted from said first control signal generator;

a transformer for switching said MOS field effect transistor to said turn-on state by a voltage excited at secondary winding according to flow a current through primary winding by switching state of said first transistor;

a first zener diode for stopping supply of electric potential, formed between a gate of said MOS field effect transistor and a source, to said transformer; and a second transistor for inverting electronic potential of a voltage excited at secondary winding of said transformer according to said second control signal, and thus for switching said MOS field effect transistor to said turn-off state through said voltage excited at said secondary winding.

8. The drive circuit of a switching element for a switching mode power supply device as defined in claim 7, further comprising:

a second Zener diode for maintaining constantly electric potential formed between the gate of said MOS field effect transistor and the source; and a second resistance for protecting said MOS field effect transistor.

9. A drive circuit of a switching element for a switching mode power supply device, comprising:

a power conversion section for converting an inputted alternating current to a direct current;

a MOS field effect transistor for switching to supply said direct current to a load;

a multivibrator for generating a drive signal having rectangular pulse form according to a DC voltage inputted from outside;

means for determining a cycle of said drive signal outputted from said multivibrator;

a transistor for stopping driving of said multivibrator according to an input signal supplied from outside;

a control signal generator for generating a first control signal and a second control signal to switch said MOS field effect transistor to a turn-on or turn-off state according to said drive signal of said oscillator and said input signal; and a drive section for generating an output signal supplied to said MOS field effect transistor, wherein said output signal is a high level according to said first control signal of high level and said output signal of high level switch said MOS field effect transistor to said turn-on state and for generating said output signal supplied to said MOS field effect transistor, wherein said output signal is a low level according to said second control signal of high level and said output signal of low level switch said MOS field effect transistor to said turn-off state.

10. A drive circuit of a switching element for a switching mode power supply device, comprising:

a power conversion section for converting an alternating current inputted to a direct current;

a MOS field effect transistor for switching to supply said direct current to a load;

an oscillator for generating a drive signal to switch said MOS field effect transistor according to an input signal supplied from outside;

a first control signal generator for generating a first control signal to switch said MOS field effect transistor to a turn-on state according to said drive signal;

a second control signal generator for generating a second control signal to switch said MOS field effect transistor to a turn-off state according to said input signal; and a drive section for generating an output signal supplied to said MOS field effect transistor, wherein said output signal is a high level according to said first control signal of high level and said output signal of high level switch said MOS field effect transistor to said turn-on state and for generating said output signal supplied to said MOS field effect transistor, wherein said output signal is a low level according to said second control signal of high level and said output signal of low level switch said MOS field effect transistor to said turn-off state.

* * * * *